(12) United States Patent
Sweeney et al.

(10) Patent No.: US 10,181,537 B2
(45) Date of Patent: Jan. 15, 2019

(54) LASER POWER CONVERTER

(71) Applicants: AIRBUS DEFENCE AND SPACE GMBH, Ottobrunn (DE); AIRBUS DS GMBH, Taufkirchen (DE)

(72) Inventors: Stephen John Sweeney, Surrey (GB); Jayanta Mukherjee, Surrey (GB)

(73) Assignee: ARIANEGROUP GMBH, Taufkirchen (DE)

( * ) Notice: Subject to any disclaimer, the term of this patent is extended or adjusted under 35 U.S.C. 154(b) by 800 days.

(21) Appl. No.: 14/421,401

(22) PCT Filed: Aug. 16, 2013

(86) PCT No.: PCT/EP2013/067161
§ 371 (c)(1),
(2) Date: Feb. 12, 2015

(87) PCT Pub. No.: WO2014/027092
PCT Pub. Date: Feb. 20, 2014

(65) Prior Publication Data
US 2015/0187971 A1    Jul. 2, 2015

(30) Foreign Application Priority Data
Aug. 16, 2012    (GB) .................................. 1214619.7

(51) Int. Cl.
*H01L 21/20*        (2006.01)
*H01L 31/0304*      (2006.01)
(Continued)

(52) U.S. Cl.
CPC ...... *H01L 31/03046* (2013.01); *H01L 31/056* (2014.12); *H01L 31/0547* (2014.12);
(Continued)

(58) Field of Classification Search
CPC ........... H01L 31/03046; H01L 31/0693; H01L 31/1844; H01L 31/056; H01L 31/0547;
(Continued)

(56) References Cited

U.S. PATENT DOCUMENTS 4,833,512 A    5/1989    Thompson
4,976,789 A   12/1990    Holloman et al.
(Continued)

FOREIGN PATENT DOCUMENTS

EP    0162541    11/1985
EP    1936700     6/2008
(Continued)

OTHER PUBLICATIONS

Andreev et al. "High Current Density GaAs and GaSb Photovoltaic Cells for Laser Power Beaming," 3rd World Conference on Photovoltaic Energy Conversion, May 11-18, 2003, Osaka, Japan, pp. 761-764.
(Continued)

*Primary Examiner* — Savitr Mulpuri
(74) *Attorney, Agent, or Firm* — Sheridan Ross P.C.

(57) ABSTRACT

A Laser Power Converter (LPC) device (1) comprises an anti-reflection coating (10), a window layer (20), an active region (30), an electron blocking layer (40), a Distributed Bragg Reflector (DBR) (50) and a substrate (60). The device further comprises an anode (70), a cathode (80) and insulating layers (90). The active region (30) is formed of indium gallium arsenide phosphide (InGaAsP), with the proportion of chemical elements in the InGaAsP layers being $In_yGa_{1-y}As_xP_{1-x}$, and is designed to convert electromagnetic radiation having a wavelength of 1.55 µm into electrical energy. However, the exact composition of the InGaAsP is chosen to have a band-gap wavelength at slightly above 1.55 µm because in operation the device heats up and the band-gap shifts to longer wavelengths. To obtain a suitable
(Continued)

band-gap the composition may be $In_yGa_{1-y}As_xP_{1-x}$, where x=0.948, 0.957, 0.965, 0.968, 0.972 or 0.976 and y=0.557, 0.553, 0.549, 0.547, 0.545 or 0.544 respectively.

23 Claims, 8 Drawing Sheets

(51) Int. Cl.

| | | |
|---|---|---|
| *H02J 50/70* | (2016.01) | |
| *H02J 50/30* | (2016.01) | |
| *H01L 31/0693* | (2012.01) | |
| *H02J 17/00* | (2006.01) | |
| *H01L 31/056* | (2014.01) | |
| *H01L 31/054* | (2014.01) | |
| *H01L 31/18* | (2006.01) | |

(52) U.S. Cl.
CPC ...... *H01L 31/0693* (2013.01); *H01L 31/1844* (2013.01); *H02J 17/00* (2013.01); *H02J 50/30* (2016.02); *H02J 50/70* (2016.02); *Y02E 10/52* (2013.01); *Y02E 10/544* (2013.01); *Y02P 70/521* (2015.11)

(58) Field of Classification Search
CPC . H02J 17/00; H02J 50/30; H02J 50/70; Y02E 10/52; Y02E 10/544; Y02P 70/521
See application file for complete search history.

(56) References Cited

U.S. PATENT DOCUMENTS

| | | | |
|---|---|---|---|
| 5,260,639 | A | 11/1993 | De Young et al. |
| 5,322,572 | A | 6/1994 | Wanlass |
| 5,639,673 | A | 6/1997 | Vaccaro et al. |
| 5,853,497 | A | 12/1998 | Lillington et al. |
| 5,902,417 | A | 5/1999 | Lillington et al. |
| 6,034,321 | A | 3/2000 | Jenkins et al. |
| 6,072,116 | A | 6/2000 | Brandhorst et al. |
| 6,252,251 | B1 | 6/2001 | Bylsma et al. |
| 6,396,117 | B1 | 5/2002 | Furukawa et al. |
| 7,079,307 | B2 | 7/2006 | Liu et al. |
| 7,209,503 | B1 | 4/2007 | Hopper et al. |
| 2002/0135035 | A1 | 9/2002 | Yamaguchi et al. |
| 2004/0238743 | A1 | 12/2004 | Gravrand et al. |
| 2005/0018331 | A1 | 1/2005 | Pautet et al. |
| 2006/0048811 | A1 | 3/2006 | Krut et al. |
| 2006/0102916 | A1 | 5/2006 | Sun et al. |
| 2007/0001254 | A1 | 1/2007 | Inada |
| 2007/0096236 | A1 | 5/2007 | Yagyu et al. |
| 2008/0191241 | A1 | 8/2008 | Ishimura |
| 2010/0019275 | A1 | 1/2010 | Nakata |
| 2010/0032652 | A1 | 2/2010 | Okamura et al. |
| 2010/0084004 | A1 | 4/2010 | Ortabasi |
| 2010/0116318 | A1 | 5/2010 | Sumida et al. |
| 2010/0151618 | A1 | 6/2010 | Sharps et al. |
| 2010/0181484 | A1 | 7/2010 | Inada et al. |
| 2010/0276547 | A1 | 11/2010 | Rubenchik et al. |
| 2011/0180129 | A1 | 7/2011 | Roberts et al. |
| 2012/0015469 | A1 | 1/2012 | Wanlass |
| 2012/0125392 | A1 | 5/2012 | Woo et al. |
| 2012/0153417 | A1* | 6/2012 | Shi .................. H01L 31/02327 257/432 |

FOREIGN PATENT DOCUMENTS

| | | |
|---|---|---|
| GB | 2255227 | 10/1992 |
| RU | 2011145778 | 5/2013 |
| WO | WO 94/06156 | 3/1994 |
| WO | WO 00/38216 | 6/2000 |
| WO | WO 02/47122 | 6/2002 |
| WO | WO 2008/028181 | 3/2008 |
| WO | WO 2009/134552 | 11/2009 |
| WO | WO 2011/160246 | 12/2011 |

OTHER PUBLICATIONS

Backus "Laser Activation of Solar Cells," Ninth IEEE Photovoltaic Specialists Conference, Silver Spring, Maryland, USA, May 2-4, 1972, pp. 61-65.
Landis "Photovoltaic Receivers for Laser Beamed Power in Space," Twenty-second IEEE Photovoltaic Specialists Conference, Las Vegas, Nevada, USA, Oct. 7-11, 1991, vol. 2, pp. 1494-1502.
Mukherjee et al. "Efficiency limits of laser power converters for optical power transfer applications," Journal of Physics D: Applied Physics, Jun. 2013, vol. 46, No. 26, 6 pages.
Nugent et al. "Laser Power for UAVs," LaserMotive, LLC, White Paper, Mar. 2010, 9 pages.
Olsen et al. "InGaAsP Quaternary Alloys: Composition, Refractive Index and Lattice Mismatch," Journal of Electronic Materials, 1980, vol. 9, No. 6, pp. 977-987.
Olsen et al. "High Efficiency Monochromatic GaAs Solar Cells," Twenty-second IEEE Photovoltaic Specialists Conference, Las Vegas, Nevada, USA, Oct. 7-11, 1991, vol. 1, pp. 419-424.
Pena et al. "The Influence of Monolithic Series Connection on the Efficiency of GaAs Photovoltaic Converters for Monochromatic Illumination," IEEE Transactions on Electron Devices, Feb. 2001, vol. 48, No. 2, pp. 196-203.
Pena et al. "Semiconductor Materials for Photovoltaic Converters Applied to Power-by-light Systems," Electron Devices, 2005 Spanish Conference on Tarragona, Spain, Feb. 2-4, 2005, pp. 291-294.
Sahai et al. "Optical Wireless Power Transmission at Long Wavelengths," Space Optical Systems & Applications (ICSOS), 2011 International Conference, May 2011, pp. 164-170.
Ünlü et al. "Resonant cavity enhanced photonic devices," Journal of Applied Physics, Jul. 1995, vol. 78, No. 2, 34 pages.
Wu et al. "Near-infrared laser-driven polymer photovoltaic devices and their biomedical applications," The Royal Society of Chemistry, Energy & Environmental Science, Aug. 2011, vol. 4, pp. 3374-3378.
English Translation of Search Report for Russia Patent Application No. 2015108905/28, dated Aug. 8, 2017, 2 pages.

* cited by examiner

LASER POWER CONVERTER

CROSS REFERENCE TO RELATED APPLICATIONS

This application is a national stage application under 35 U.S.C. 371 and claims the benefit of PCT Application No. PCT/EP2013/067161 having an international filing date of Aug. 16, 2013, which designated the United States, which PCT application claims the benefit of Great Britain Application No. 1214619.7 filed Aug. 16, 2012, the disclosures of each are incorporated by reference herein.

FIELD OF THE INVENTION

The present invention relates to laser power converter (LPC) devices for converting electromagnetic energy into electrical energy. In particular, the present invention relates to an LPC optimised to receive electromagnetic radiation at a desired wavelength.

BACKGROUND TO THE INVENTION

Devices for converting electromagnetic energy into electrical energy have been in existence for some decades now. These devices are often known as photovoltaic devices. A fundamental property of any such device is its efficiency, that is, the amount of electrical energy extracted when compared to the electromagnetic energy received. An aim of photovoltaic cell design is to achieve the highest possible efficiency, that is, to extract as much electrical energy as possible from a given amount of received electromagnetic energy.

Perhaps the most common form of photovoltaic device is the solar cell, designed to harness the energy of the sun for electrical power generation. Solar cells are found across a broad range of applications, from pocket calculators to solar powered aircraft. One design consideration when attempting to maximise the efficiency of solar cells is the range of wavelengths at which light from the sun is transmitted.

There is also interest in another form of photovoltaic device, for power transmission. Conventionally, electrical power is carried from its source to the point at which it is to be used by electrical wiring. However, by using photovoltaic devices it is possible to receive energy that has been transmitted in the form of high frequency electromagnetic radiation.

Efforts have been made to design photovoltaic devices for receiving energy from a narrow spectral linewidth light source, typically a laser, within a power transmission system. For example, an electrically powered laser may generate electromagnetic radiation which may in turn be received by a photovoltaic device able to convert it back into electrical energy. Photovoltaic devices are often referred to as Laser Power Converters (LPCs) in this context.

Broadly speaking, power transmission using photovoltaic devices lends itself to situations in which conventional electrical wiring either suffers from unwanted electromagnetic interference or is difficult to install. For example, electrical wiring faces interference when located in close proximity to high voltages. This interference effect is negligible if energy is carried in the form of electromagnetic radiation through fibre optic cables. The use of fibre optic cables has the additional advantage of reducing the possibility of unwanted sparking, which can be dangerous in a variety of circumstances.

The application of photovoltaic devices for power transmission in circumstances where it is difficult or impossible to install cabling of any kind may allow electromagnetic energy to be transmitted through free space For example, satellites orbiting the earth are in an ideal position to generate electrical energy using solar power. It may be possible for this energy to be beamed down to earth by laser where it can be subsequently reconverted to electrical energy by photovoltaic cells at a receiving station. This may allow energy to be transmitted to regions of the earth which cannot for practical reasons be connected to an existing power supply.

In addition, LPCs may also be useful for applications including remote powering of subcutaneous electrical devices for medical diagnostics and related applications, and line-of-sight wireless powering of electronic equipment.

Electromagnetic radiation generated by a laser is substantially monochromatic, i.e. a laser emits over a very narrow range of wavelengths, in contrast with the broad range of wavelengths transmitted from the sun. Therefore the design considerations for maximising the efficiency of LPC devices differ from those for maximising the efficiency of solar cells.

For example, V. Andreev et. al. "High current density GaAs and GaSb photovoltaic cells for laser power beaming", Photovoltaic Energy Conversion Conference, page 761 (2003) reports efficiencies of above 50% being achieved for GaAs-based photovoltaic devices at a wavelength in the region of 820 nm to 850 nm. This document describes photovoltaic devices formed on a GaAs substrate which include a Distributed Bragg Reflector formed of alternating layers of AlAs and GaAs in order to increase the responsivity of the device at wavelengths between 830 nm and 870 nm. The document further describes the use of iodine lasers operating at a wavelength of 1315 nm in power transmission, and investigates the possibility of photovoltaic devices based on a GaSb substrate for receiving electromagnetic radiation at this wavelength.

A. W. Bett et. al. "III-V solar cells under monochromatic illumination", Photovoltaic Specialists Conference, page 1 (2008) provides a comparison of the efficiency achieved using photovoltaic devices having active regions formed of different materials, namely GaAs, GaInP and GaSb. A peak efficiency of 54% was achieved using a GaAs active region, the peak being achieved at a wavelength of around 810 nm. The document also describes a dual junction GaAs photovoltaic device employing a Distributed Bragg Reflector.

Although the above-described efforts to design LPCs for particular wavelengths have met with some success, they are limited in their application. In particular, although a maximum efficiency of above 50% has been achieved, this is achieved at wavelengths of around 810 nm to 870 nm. In practice, such wavelengths are of limited use. For example, at this wavelength, electromagnetic radiation is not "eye-safe" and skin-safe. "Eye-safe" radiation occurs at wavelengths of around 1.4 µm and above, and provides substantially lower risk of damaging the human eye than radiation at shorter wavelengths. Eye-safe radiation is generally considered to be skin-safe. There is a clear benefit in using eye-safe radiation when using lasers to transmit power.

Another disadvantage of electromagnetic radiation having a wavelength in the region of around 810 nm to 870 nm is the attenuation of such radiation that occurs as it passes through either conventional optical fibres or the atmosphere. In either case, energy is lost before it is received by the photovoltaic device.

For these reasons, investigations have been made into power transmission using electromagnetic radiation at longer wavelengths. However, the efficiencies achieved at longer wavelengths have been much lower than those in the 800 nm region.

S. J. Wojtczuk et. al. "Long-wavelength laser power converters for optical fibers", Photovoltaic Specialists Conference, page 971 (1997) discusses photovoltaic devices for receiving electromagnetic radiation at wavelengths of 1.55 µm and 2.1 µm. In this context, the document describes photovoltaic devices using InGaAs formed on an InP wafer. The maximum reported efficiency for photovoltaic cells using InGaAs is around 35% at a wavelength of 1.55 µm.

H. Miyakawa et. al. "Photovoltaic cell characteristics for high-intensity laser light" Solar Energy Materials & Solar Cells, p 253 (2005) also describes InGaAs/InP photovoltaic devices. However, the peak efficiency described in this document is around 24% at a wavelength of 1480 nm.

It can be seen that the efficiencies achieved in these two systems are fairly low and nowhere near even 50%. Devices with such efficiencies are of limited benefit in a practical LPC system.

SUMMARY OF THE INVENTION

According to a first aspect of the present invention, there is provided a laser power converter 'LPC' device for receiving incident electromagnetic radiation at a wavelength of about 1550 nm, the LPC comprising: a substrate; and an active region comprising an n-doped layer and a p-doped layer, the n-doped and p-doped layers being formed of InGaAsP, the active region being arranged to absorb photons of electromagnetic radiation having an associated wavelength of about 1550 nm; wherein the InGaAsP is lattice matched to the substrate.

The LPC device may have an increased efficiency for converting 1550 nm radiation to electrical energy compared to known LPCs. For example, the efficiency may be at least 44% at a power density of 1 kWm$^{-2}$ (the power density provided by the sun on the earth's surface, at which solar cell efficiencies are generally quoted) and may be above 50%.

When a photon generates a charge carrier pair in the active region of a photovoltaic device, this involves exciting an electron from the valence band to the conduction band across a band gap. The electrical energy created by this process is very close to the band gap energy of the absorbing material (the energy created is just short of the band-gap, equal to the separation of the quasi Fermi levels multiplied by the charge of an electron). If the incident photon has energy less than the band gap it is not absorbed, the electron cannot be excited and no electrical energy is produced. On the other hand, if the energy of the incident photon is greater than the band gap, then the electron may be excited, but any excess energy is lost to the system as heat before it can be extracted to an external circuit. The excess energy is known as the quantum deficit. The band gap of the InGaAsP active region can be chosen such that the responsivity of the LPC device is maximised at a wavelength of 1550 nm, by appropriately choosing the InGaAsP alloy composition resulting in an appropriate balance between the loss due to the quantum deficit and a gain due to increasing density of states with energy in the device for a range of operating conditions. This increases the optical to electrical conversion efficiency, or cell-efficiency, of the device.

The attenuation of electromagnetic waves in silica-based fibre optic cables is at a minimum at 1.55 µm, making an LPC converting radiation at this wavelength particularly useful. Moreover, there is an atmospheric window (i.e. a minimum attenuation of electromagnetic waves passing through the atmosphere) at this wavelength. As mentioned above, laser light at wavelengths above 1.4 µm is often referred to as "eye-safe", as above this frequency light is strongly absorbed by the cornea and lens in the eye before it can reach and damage the retina. Wavelengths of 1.4 µm and above are also skin-safe. Specifically, such wavelengths are eye-safe and skin-safe up to a power density of 1 KW/m$^2$. Accordingly, there are safety advantages to using wavelengths above 1.4 µm for power transmission.

The InGaAsP active region being lattice matched to the substrate may minimise losses caused by defect-related recombination of either electrons or holes.

The active region is preferably formed of $In_yGa_{1-y}As_xP_{1-x}$, where x=0.948, 0.957, 0.965, 0.968, 0.972 or 0.976 and y=0.557, 0.553, 0.549, 0.547, 0.545, 0.544 respectively. These compositions may achieve maximum conversion efficiency from the LPC with InGaAsP active region for 1550 nm incident radiation. This may be achieved at around ambient temperature of the active and up to around 30 degrees Celsius above ambient temperature.

The compositions may balance factors affecting device efficiency of the density of states, quantum deficit and self-heating of the absorbing active region in the LPC, which causes band-gap shrinkage. A band-gap at a wavelength longer than 1550 nm may be chosen to maximise absorption efficiency of 1550 nm radiation, due to the above effects for example.

Because the absorption for InGaAsP plateaus at wavelengths shorter than the band-gap wavelength, the incident photon to electron conversion efficiency at wavelengths just short of the band-gap wavelength, which ultimately decides the optical to electrical conversion efficiency of the LPC under monochromatic illumination, is almost the same for a range of wavelengths just short of the band-gap wavelength. Therefore more than one composition is possible.

The active region is lattice matched to the substrate, and, preferably, so are all other layers of the device. This eliminates strain in the device. Accordingly, it is possible to manufacture devices having relatively thick layers without causing unwanted defects in the crystal lattice, the relative thickness increasing the likelihood that photons passing through the active layer will generate charge-carrier pairs, while the lack of defects increases the likelihood that charge carriers once generated can be successfully extracted. Accordingly, the efficiency of the device may be increased.

Preferably, the substrate is formed of a binary alloy comprising one of the two group III elements of the active semiconductor material and one of the two group V elements of the active semiconductor material. Growth on other substrates, for example elemental group IV materials such as silicon may also be possible with metamorphic growth. Using a III-V based substrate ensures that the material properties of the device are as consistent as possible, assisting the manufacturing process and the lattice matching of the active semiconductor material of the active layer to the substrate. In preferred embodiments, the substrate is formed of InP.

Preferably, the device further comprises a reflecting element tuned to reflect electromagnetic radiation at the desired wavelength. Accordingly, the reflecting element can be used to reflect electromagnetic radiation that is not absorbed by the active region when it first passes through it, back to the active region for a second opportunity to be absorbed. This increases the overall likelihood that a given photon will generate a charge carrier pair in the active region, thus converting electromagnetic energy into electrical energy. Therefore, the reflecting element increases the efficiency of the device.

Preferably, the reflecting element is a Distributed Bragg Reflector comprising alternate layers of a first material and a second material. Preferably, the materials of the Distributed Bragg Reflector are consistent with those of the rest of the device. In particular, the first material is preferably the active semiconductor material. In addition, or alternatively, the second material may be the same as that from which the substrate is formed. It is also possible to use multilayer dielectric coatings to form the Distributed Bragg Reflector. For example, in an embodiment of the invention in which the substrate is formed of InP, the alternate layers of the Distributed Bragg Reflector may be formed of InGaAsP and InP.

Preferably, the reflecting element is lattice matched to the substrate, thereby reducing the strain in the device. In preferred embodiments, the reflecting element is disposed between the substrate and the active region. Accordingly, electromagnetic radiation which reflects from the reflecting element to the active region need not pass through the substrate.

Preferably, the device further comprises an anode in direct contact with the p-doped layer; and a cathode in direct contact with the n-doped layer, wherein the anode and the cathode are arranged such that an optical pathway exists between the active region and the reflecting element that does not pass through either the anode or the cathode.

Preferably, the n-doped layer and the p-doped layer are separated in a first direction and the anode and cathode are separated in a second direction perpendicular to the first direction.

The arrangement of cathode, electrode and reflecting element allows light to be reflected from the reflecting element to the active region without being blocked by the anode or the cathode. However, since the anode and the cathode are both in direct contact with the active region, it is possible to extract charge carriers generated in the active region without any requirement for it them to pass through the reflecting element. The arrangement ensures the shortest possible extraction path for charge carriers, minimising the possibility that they will recombine and therefore fail to be extracted. Typically, charge carriers will recombine after a period of around 10 ns. By providing a short extraction path length, a larger proportion of charge carriers will be extracted to the external electrical circuit before they recombine either radiatively or non-radiatively. As such, the arrangement of the anode and the cathode increases the efficiency of the device.

Preferably, the anode and the cathode are disposed in troughs extending from a surface of the device to the active region. This arrangement provides a convenient and effective manner in which to allow the anode and cathode to be laterally separated in such a way as to retain an optical path from the active region to the reflecting element which is not impeded by either the anode or cathode.

In a preferred embodiment, the device further comprises one or more insulating layers disposed between the p-doped section of the active region and the cathode and/or between the n-doped region of the active region and the anode. This ensures that the anode and/or cathode are only in contact with the required layer of the active region.

Preferably, the n-doped layer comprises an n-doped absorption layer and an n-doped contact layer and the cathode is in direct contact with the n-doped contact layer. The n-doped contact layer can have a higher level of n-doping than the n-doped absorption layer, thereby providing an improved Ohmic contact between the n-doped layer and the cathode.

In preferred embodiments, the device further comprises an electron blocking layer disposed between the active region and a/the substrate, wherein the composition of the electron blocking layer is such that a conduction band offset energy exists at an interface between the active region and the electron blocking layer.

The electron-blocking layer can reduce the number of electrons which leak into unwanted parts of the device. In particular, the electron blocking layer can help to ensure that electrons are directly extracted by a/the cathode.

In preferred embodiments, the n-doped layer comprises an n-doped absorption layer and an n-doped contact layer and the interface between the electron blocking layer and the active region is between the electron blocking layer and n-doped contact layer.

According to a further aspect of the present invention, there is provided a method for manufacturing a laser power converter 'LPC' device for receiving incident electromagnetic radiation at a wavelength of about 1550 nm, the method comprising the steps of:

forming a substrate; and forming an active region comprising an n-doped layer and a p-doped layer, the n-doped and p-doped layers being formed of InGaAsP, the active region being arranged to absorb photons of electromagnetic radiation having an associated wavelength of about 1550 nm;

wherein the InGaAsP is lattice matched to the substrate.

BRIEF DESCRIPTION OF THE DRAWINGS

Preferred embodiments of the present invention are described below, by way of example only, with reference to the accompanying drawings, in which.

DETAILED DESCRIPTION

Figure 1:
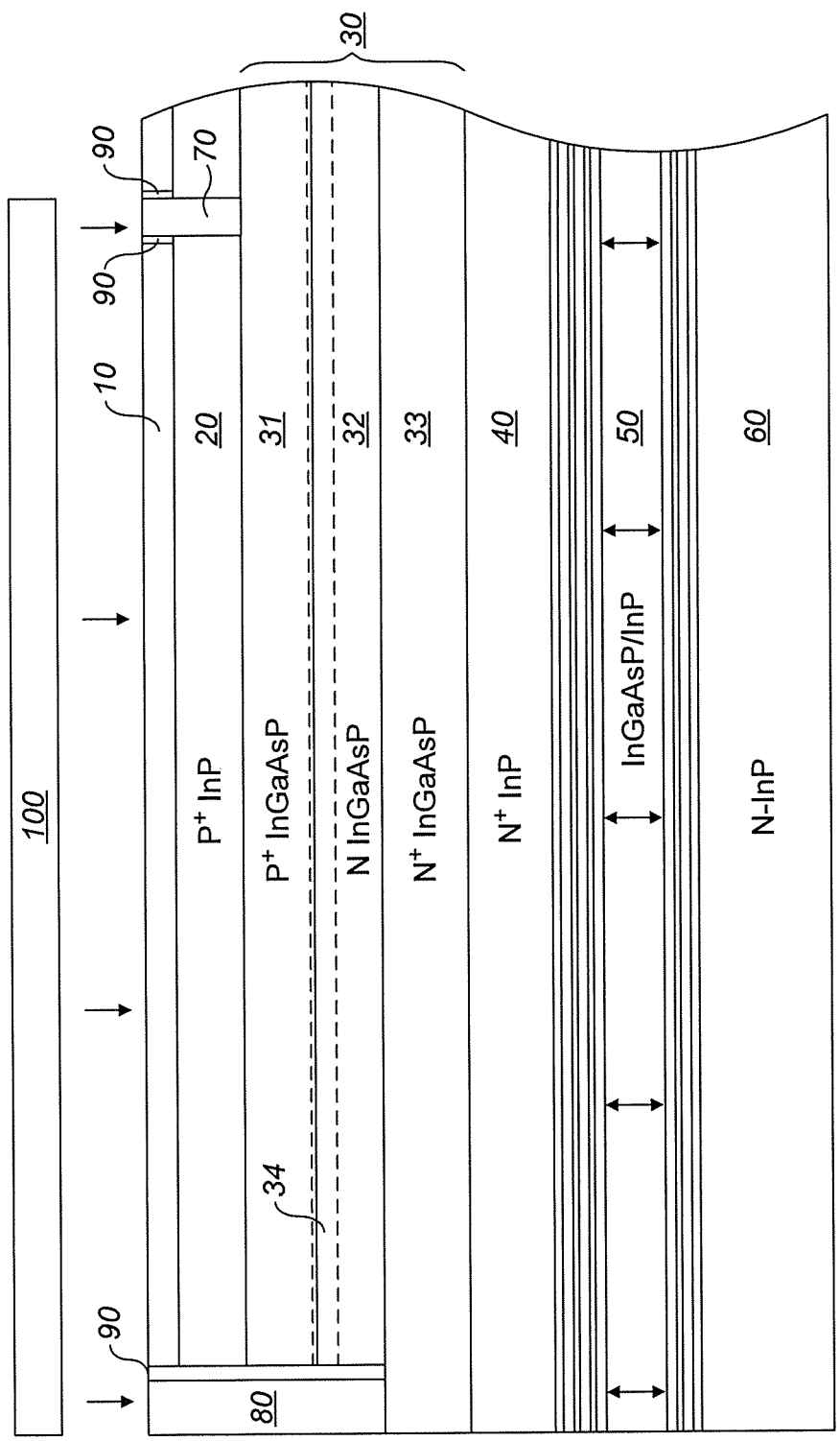
FIG. 1 shows a side view of an LPC device according to a preferred embodiment of the present invention.

Referring to FIG. 1, according to a first preferred embodiment of the invention there is provided an LPC device 1. The device 1 comprises an anti-reflection coating 10, a window layer 20, an active region 30, an electron blocking layer 40, a Distributed Bragg Reflector (DBR) 50 and a substrate 60. The device further comprises an anode 70, a cathode 80 and insulating layers 90.

The active region 30 is formed of indium gallium arsenide phosphide (InGaAsP), with the proportion of chemical elements in the InGaAsP layers being $In_yGa_{1-y}As_xP_{1-x}$.

The LPC device of the preferred embodiment shown in FIG. 1 is designed to convert electromagnetic radiation having a wavelength of 1.55 µm into electrical energy. However, the exact composition of the InGaAsP may be chosen to have a band-gap wavelength at slightly above 1.55 µm because in operation the device heats up and the band-gap shifts to longer wavelengths. In operation, the junction temperature may usually be anything from ambient temperature to 30 degrees Celsius above the ambient temperature.

To obtain a suitable band-gap the composition may be $In_yGa_{1-y}As_xP_{1-x}$, where x=0.948, 0.957, 0.965, 0.968, 0.972 or 0.976 and y=0.557, 0.553, 0.549, 0.547, 0.545 or 0.544 respectively. All of these compositions may achieve a high conversion efficiency at elevated junction temperatures, although dependent on the particular temperature some may be better suited than others and will give slightly higher conversion efficiency. This is due to the fact that although the absorption profile below the band-gap of the absorber plateaus, the plateau is not absolutely flat and steeps slightly towards shorter wavelengths. The skilled person may select a composition most appropriate in the circumstances. In other words, the optimum composition may be chosen dependent on how the LPC is deployed with different compositions suit different operating conditions better. For example, under high illumination intensity conditions, causing the junction temperature to rise, or high ambient temperatures, a shorter band edge cell may be chosen. In cooler situations a longer wavelength composition may be chosen.

In this embodiment, the substrate 60 comprises an Indium Phosphide (InP) wafer, such as is available from Wafer Technology Ltd. The substrate is approximately 80 µm thick.

The DBR 50 is disposed directly above the substrate and is optimised to reflect electromagnetic radiation having a wavelength of 1.55 µm. The DBR 50 is formed of alternating layers of InP and InGaAsP with the proportion of chemical elements in the InGaAsP layer as again being $In_yGa_{1-y}As_xP_{1-x}$. The InGaAsP layers are lattice matched to the InP, thereby minimising strain between the layers of the DBR 50.

In the preferred embodiment, the InP and InGaAsP layers of the DBR 50 have a refractive index ratio of 3.48:3.17. As mentioned above, the DBR 50 is optimised to reflect electromagnetic radiation having a wavelength of 1.55 µm. For example, the thickness of the InP and InGaAsP layers is optimised to reflect electromagnetic radiation having a wavelength of 1.55 µm. In the preferred embodiment, there are between 10 and 30 layers of each of InP and InGaAsP in the DBR 50.

The electron blocking layer 40 is disposed on the DBR 50. The electron blocking layer is formed of n-doped InP and has a thickness of around 0.1 µm. The level of n-doping in the electron blocking layer 40 is in the range $5*10^{18}$ cm$^{-3}$ to $1*10^{19}$ cm$^{-3}$, and is preferably around $1*10^{19}$ cm$^{-3}$. The electron blocking layer 40 prevents the leakage of electrons from the active region 30.

The active region 30 comprises a p-doped layer 31 and an n-doped layer 32, 33. The n-doped layer 32, 33 comprises two distinct sub-layers, an n-doped absorption layer 32 and an n-doped contact layer 33. The n-doped absorption layer 32 is disposed adjacent to the p-doped layer 31 and the n-doped contact layer 33 is disposed adjacent to the n-doped absorption layer 32. FIG. 1 also illustrates the depletion region 34 which is formed at the interface between the p-doped layer 31 and the n-doped absorption layer 32.

The p-doped layer 31 has a doping in the range $1*10^{18}$ cm$^{-3}$ to $3*10^{18}$ cm$^{-3}$, and preferably around $2*10^{18}$ cm$^{-3}$. The p-doped layer 31 has a thickness of around 0.75 µm. It is preferred not to employ a significantly thicker p-doped layer 31 because of possible charge carrier recombination effects in the p-doped layer 31, such as inter-valence band absorption.

The n-doped absorption layer 32 is relatively thick, with a thickness of around 4.75 µm and has a relatively low level of doping in the range $1*10^{17}$ cm$^{-3}$ to $3*10^{17}$ cm$^{-3}$, and preferably around $1*10^{17}$ cm$^{-3}$. The relative thickness of the n-doped absorption layer 32 increases the likelihood that photons passing through the device 1 will be absorbed in the n-doped absorption layer 32.

The n-doped contact layer 33 has a thickness of around 0.5 µm and a doping in the range $5*10^{18}$ cm$^{-3}$ to $1*10^{19}$ cm$^{-3}$, and preferably around $1*10^{19}$ cm$^{-3}$. The relatively high doping of the n-doped contact layer 33 compared to the n-doped absorption layer 32 is provided to give a superior Ohmic contact between the active region and the cathode 80, thereby allowing the effective extraction of current from the device 1. Moreover, the gradient in doping levels between the n-doped contact layer 33 and the n-doped absorption layer 32 provides a potential difference which encourages the extraction of current from the n-doped absorption layer 32.

The proportion of elements in the active region 30 is such that the active region 30 is lattice matched to the other features of the photovoltaic device 1. In particular, the active region 30 is lattice matched to the substrate 60. This reduces the strain in the device 1, which means that fewer defects are created as the device 1 is grown. As a result, the efficiency of the device 1 is increased as defects are effective to increase the resistance of the device to charge carriers. That is to say, by reducing the number of defects in the device 1, the efficiency of the device 1 in converting charge-carrier pairs into electrical energy successfully extracted by the anode 70 and the cathode 80 is increased. Higher defect levels typically lead to energy being lost as heat.

As the active region 30 is lattice matched to the remaining features of the device 1, it is possible to grow relatively thick layers of the active region 30 without causing excessive defects. In turn, this increases the likelihood that photon passing through the active region 30 will be captured, thereby generating a charge carrier pair.

Moreover, the proportions of chemical elements in the active region 30 are chosen so that the responsivity of the active region 30 is at a maximum at the wavelength of 1.55 µm. By choosing the proportion of chemical elements, the band gap of the active region 30 can be selected such that the responsivity of the active region 30 is maximised. Moreover, because the active region 30 contains two group III elements (Indium, Gallium) together with two group V elements (Arsenic, Phosphorous), it is possible both to lattice match the active region 30 to the substrate 60 and select an appropriate band gap simultaneously.

The window layer 20 is disposed on the active region 30 and is formed p-doped InP. The level of p doping in the window layer 20 is in the range $1*10^{18}$ cm$^{-3}$ to $3*10^{18}$ cm$^{-3}$, and preferably around $2*10^{18}$ cm$^{-3}$. The thickness of the window layer is around 0.2 µm. The window layer is effective to prevent holes leaking upwards from the p-doped layer 31, thereby assisting in the extraction of holes directly from the p-doped layer 31 by the anode 70.

The anti-reflection coating 10 is disposed on the window layer 20. The anti-reflection coating is formed of Silicon Nitride ($Si_3N_4$) and has a thickness of around 210 nm. This provides a reflectivity at 1.55 µm of around 0.4%. In alternative embodiments, other materials may be used for the anti-reflection coating, such as Silicon Dioxide ($SiO_2$).

The anode 70 and the cathode 80 are laterally spaced and are both in direct contact with the active region 30. The arrangement of the anode 70 and the cathode 80 allows an optical path between the active region 30 and the DBR 50 which does not pass through either the anode 70 or the cathode 80. The anode 70 and the cathode 80 both have a lateral extent in the range 0.2 µm to 0.4 µm, and preferably around 0.2 µm. The anode 70 and/or the cathode 80 are preferably metallic, and in particular may be contacts formed of Ti/Pt/Au (Titanium/Platinum/Gold) or Au/Ge/Ni (Gold/Germanium/Nickel).

The anode 70 and cathode 80 both extend from the same surface of the device. As shown in FIG. 1, this is the top surface of the device.

The arrangement of the anode 70 and the cathode 80 allows photons that pass through the active region 30 without being absorbed and subsequently reflected by the DBR 50 back into the active region 30, thereby providing a further opportunity for the photons to be absorbed. Moreover, because the anode 70 and the cathode 80 are in direct contact with the active region 30, charge carriers do not lose energy in other layers of the device 1 as electrical energy is extracted from the device 1.

An insulating layer 90 is disposed between the cathode 80 and p-doped layer 32 of the active region 30 in order to prevent the device being short-circuited. In the preferred embodiment, the insulating layer 90 is formed of Silicon Dioxide ($SiO_2$) and is around 0.2 µm thick. FIG. 1 also shows additional insulating layers 90 surrounding the anode 70 as it passes through the window layer 10.

Figure 2A:
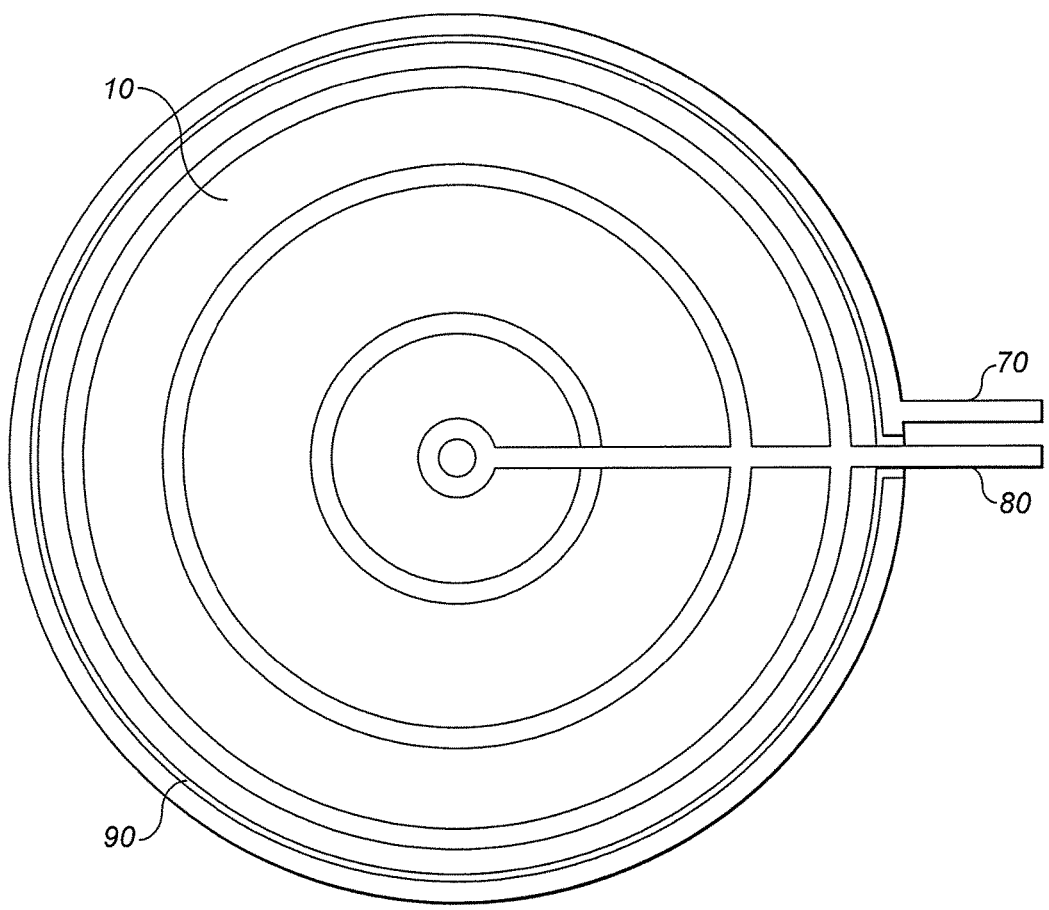
FIG. 2A shows a top-down view of the preferred embodiment illustrated in FIG. 1.

FIG. 2A shows a top down view of the photovoltaic device 1 of the preferred embodiment. It can be seen that the device 1 has a circular profile. FIG. 2A illustrates how the anode 70 and the cathode 80 are laterally separated. In the preferred embodiment, the anode comprises a series of concentric circles separated by around 0.64 cm together with a radial spur which connect the concentric circles and provides an external contact. The cathode 80 is formed around the outer periphery of the device 1.

The separation of the concentric circles of the anode 70 is chosen to provide an optimal balance between the distance charge carriers must travel in the active region 30 before electrical energy is extracted by the anode 70 and the amount of "shadowing" by which the anode covers the active region 30, thereby preventing photons from reaching the active region 30. One skilled in the art will recognise that alternative arrangements of laterally spaced anode 70 and cathode 80 may be used.

Figure 2B:
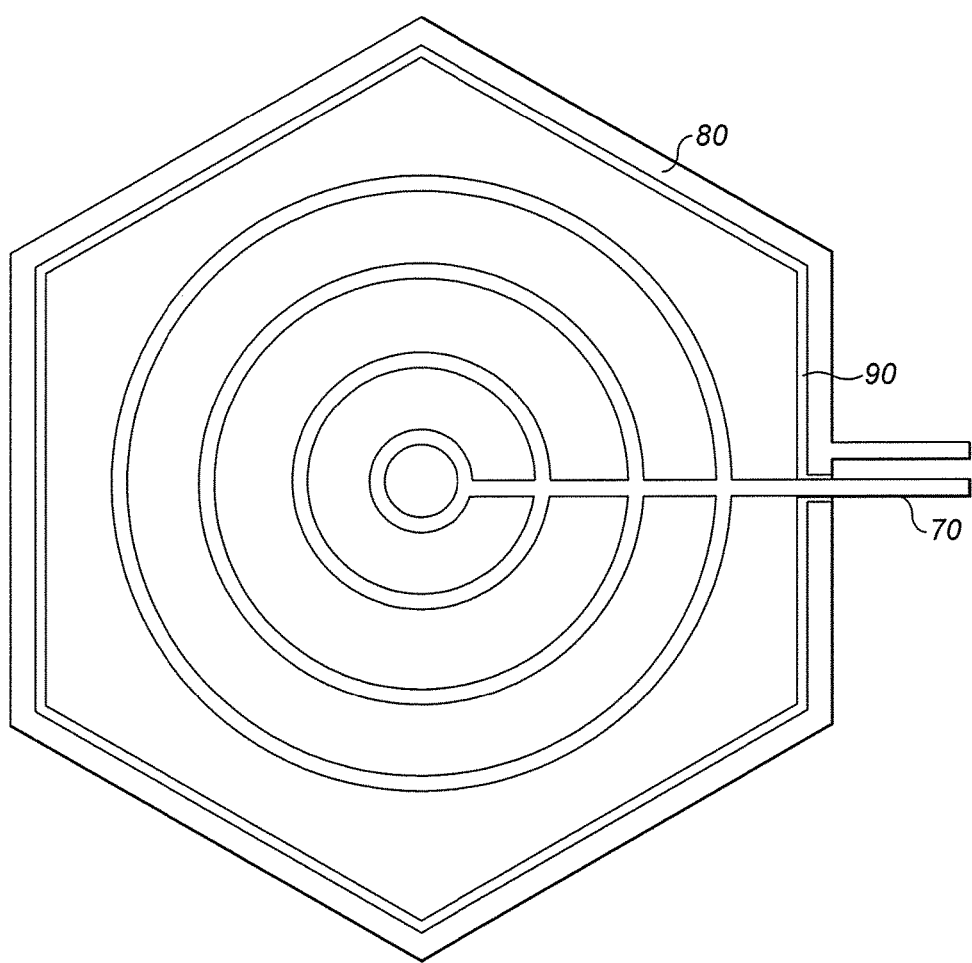
FIG. 2B shows a top-down view of an alternative embodiment of the present invention.

In some alternative embodiments, the circular profile of the device 1 shown in FIG. 2A may be altered to provide a device which may be more easily tessellated into an array. For example, FIG. 2B shows the device 1 with a hexagonal profile. As such, an array of devices may be tightly packed side-by-side with minimal wasted space.

The device 1 is formed by Molecular Beam Epitaxy (MBE) or Metal-Organic Chemical Vapour Deposition (MOCVD) (this is also sometimes referred to as Metal-Organic Vapour Phase Epitaxy (MOVPE)), where the various layers are grown in sequence under a high vacuum. First, the DBR 50 is provided on the substrate by forming alternate layers of InP and InGaAsP. Next, the electron blocking layer 40 is provided by forming a layer of n-doped InP the DBR 50. The active region 30 is then provided on the electron blocking layer 40 by forming, in sequence, the n-doped contact layer 33, the n-doped absorption layer 32 and the p-doped layer 31. Each of these is formed of InGaAsP with appropriate doping as described above. The proportion of chemical elements in the active region 30 is such that it is lattice matched to the substrate 50 and has a band gap which corresponds to a maximum responsivity of the device at the wavelength of 1.55 µm. The window layer 20 is formed on the active region 30 by forming a layer of p-doped InP. The anti-reflection coating 10 is then formed on the window layer 20.

The depletion region 34 naturally occurs as the p-doped layer 31 and the n-doped absorption layer 32 are formed adjacent to each other. The depletion represents an area across which a potential difference has been formed, thereby ensuring that as charge carrier pairs are formed in the active region 30 they can be extracted at the anode 70 and the cathode 80.

The anode 70, cathode 80 and the insulating layers 90 are then formed by lithographic techniques. That is, they are formed by creating troughs in the surface of the device 1 into which the anode 70, the cathode 80 and the insulating layers 90 are disposed.

In use, a laser can be used to provide a source of monochromatic (i.e. single wavelength) electromagnetic radiation, illustrated as flat wavefront 100 in FIG. 1, although the skilled person will appreciate that the incident wavefront need not always be flat. As shown in FIG. 1, the electromagnetic radiation enters the device from above, passing through the anti-reflection coating 10 first.

The anti-reflection coating 10 minimises the amount of electromagnetic radiation that is reflected from the device 1. The electromagnetic radiation then passes through the window layer 20. The window layer 20 blocks holes created in the p-doped layer 31 from reaching the surface of the device 1. This provides particular advantages because the surface of the device 1 (and indeed any grown semiconductor device) will have a relatively large density of defects. As such, if holes reach the surface of the device 1 they are likely to recombine with electrons at these defects, resulting in a loss of photo-generated carriers. Accordingly, the window layer 20 is effective to reduce these losses. The window layer does not inhibit the transmission of the around 1.55 µm electromagnetic radiation provided by the laser.

The electromagnetic radiation then enters the active region 30. At this point, the effect of the electromagnetic radiation can be best understood by considering it as a sequence of photons. As each photon passes through the active region 30, it may interact with the material of the active layer in order to excite an electron from the valence band to the conduction band, thereby creating a charge carrier pair (i.e. the excited electron and the hole it leaves in the valence band). The charge carriers of the charge carrier pair then travel to the cathode 70 and the anode 80 to allow electrical energy to be extracted from the device 1.

In the active region 30 of the device 1 shown in FIG. 1, the majority of the absorption of photons occurs in the relatively thick n-doped absorption layer 32. However, absorption may also occur in the p-doped layer 31 or the n-doped contact layer 33.

The energy given to an electron to excite it from the valence band to the conduction band must be at least equal to the band gap of the material. Accordingly, by selecting the material of the active region 30 appropriately, the active region 30 can be optimised for receiving electromagnetic radiation of a given wavelength (as the energy of each photon depends on the wavelength). If the incident photons have an energy larger than the band-gap are absorbed, the generated electrons will need to lose this excess energy as heat before they reach the band-edge and can be extracted as electrical energy. On the other hand, photons with energy less than the band-gap will not be absorbed and there will be no photo-generated carriers to extract. As a result, selecting an appropriate band gap can ensure the maximum electrical energy can be extracted for an incident photon of a given wavelength.

Photons which are not absorbed in the active region 30 pass through the electron blocking layer 40 to the DBR 50, where they are reflected. As a result, the photons are returned to the active region 30, where they have a further opportunity to excite electrons from the valence band to the conduction band. Accordingly, the DBR 50 increases the likelihood that a given photon will be converted into a charge carrier pair, as there are two opportunities for the photon to the absorbed by the active region 30.

Figure 3:
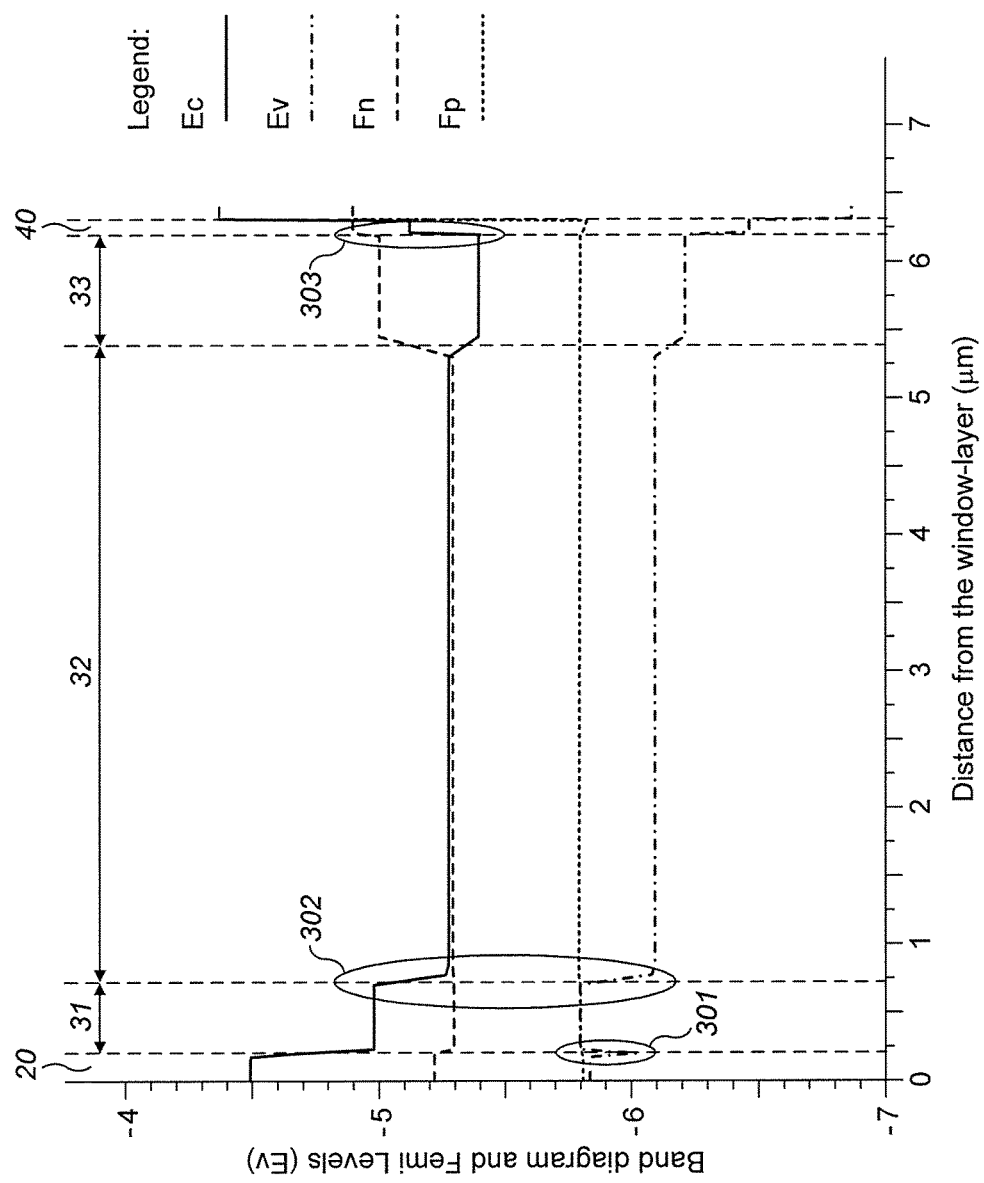
FIG. 3 illustrates conduction and valence band energies and Fermi levels across the layers of the preferred embodiment.

The preferred embodiment shown in FIGS. 1 and 2 provides an efficient photovoltaic device designed to operate at 1.55 μm. The operation of the device 1 can be further understood with reference to FIG. 3. FIG. 3 illustrates the conduction band energy, Ec, the valence band energy Ev, the conduction band Fermi level Fn and the valence band Fermi level Fp across the window layer 20, p-doped layer 31, n-doped absorption layer 32, n-doped contact layer 33 and electron blocking layer 40 of the device 1 when it is under illumination.

In particular, FIG. 3 illustrates the transitions between these layers. For example, FIG. 3 shows a valence band offset 301 at the interface of the p-doped layer 31 and the window layer 20. The valence band offset 301 inhibits the flow of holes between the p-doped layer 31 and the window layer 20, thereby retaining holes in the p-doped layer for extraction by the anode 80. Accordingly, holes are prevented from reaching the surface of the device 1 and combining with defects in this region.

FIG. 3 also illustrates the homojunction 302 between the p-doped layer 31 and the n-doped absorption layer 31. As these layers have the same band gap, it is relatively easy for charge carriers to cross and subsequently be extracted by the anode 70 and the cathode 80.

A conduction band offset 303 can be seen at the interface of the n-doped contact layer 33 and the electron blocking layer 40. This has the effect of inhibiting the transfer of electrons from the n-doped contact layer 33 to the electron blocking layer 40. As such, electrons are retained within the n-doped contact layer 33 for extraction by the cathode 80.

Figure 4:
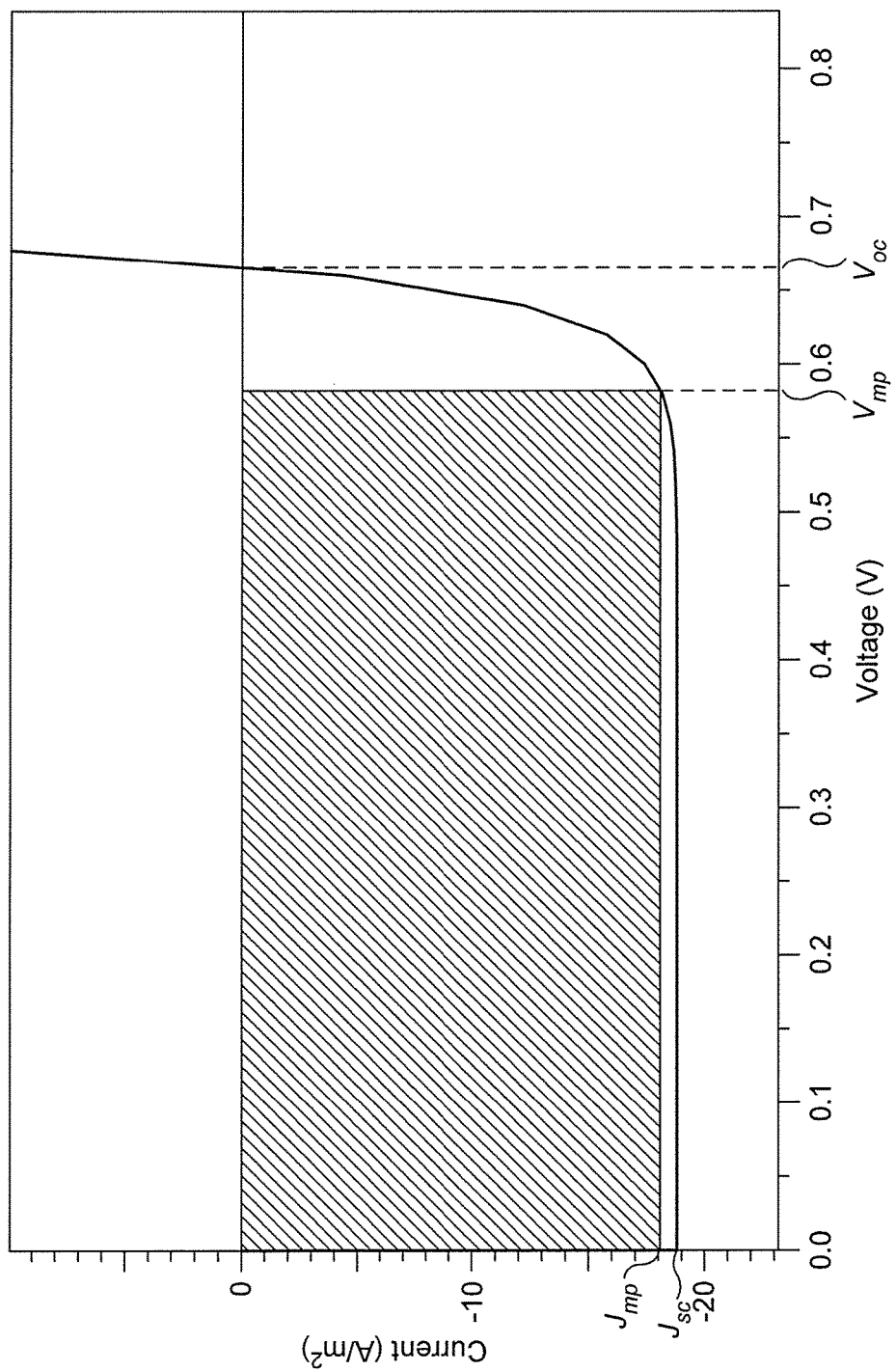
FIG. 4 shows the current density-voltage curve of the preferred embodiment under illumination of 1 W/m$^2$ at a wavelength of 1.55 µm.

FIG. 4 shows the current density-voltage response of the device 1 when under illumination by a laser light of a wavelength of 1.55 um at a power per unit area of 1 W/m². In particular, the short circuit current density extracted from the device 1 is illustrated on the y-axis against voltage across the device 1 on the x-axis. The shaded area 401 reflects the Fill Factor of the device 1. The Fill Factor is defined as the ratio of the maximum power output of the device ($V_{MP} \cdot J_{MP}$) to the product of the open circuit voltage ($V_{OC}$) and the short circuit current density ($J_{SC}$), which represents a maximum theoretical power output. As such, the Fill Factor is an important quality relating to the performance of the device 1. The efficiency of the preferred embodiment of the present invention can be calculated as 63.2565%.

Figure 5A:
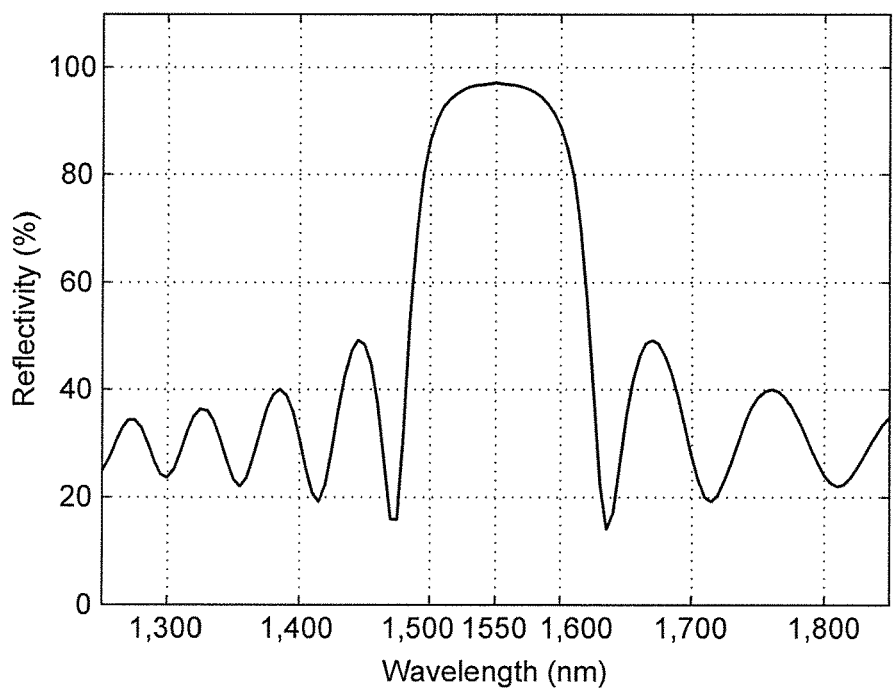
FIG. 5A shows the calculated reflectivity of a Differential Bragg Reflector having twenty pairs of InGaAsP and InP layers as a function of wavelength.
Figure 5B:
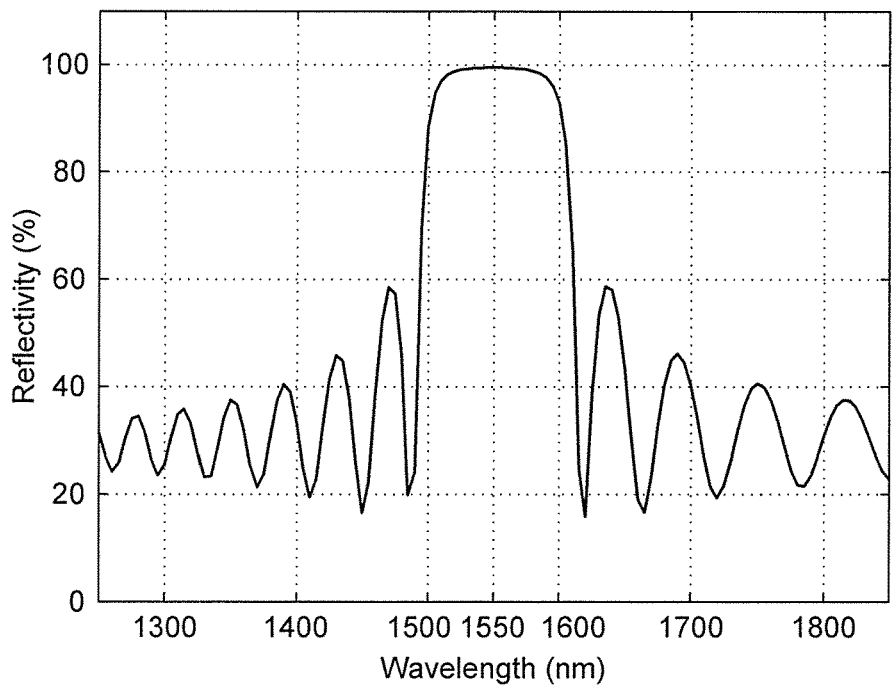
FIG. 5B shows the calculated reflectivity of a Differential Bragg Reflector having thirty pairs of InGaAsP and InP layers as a function of wavelength.

FIGS. 5A and 5B illustrate the reflectivity of the DBR 50 as a function of wavelength. In particular, FIG. 5A shows the reflectivity of a DBR 50 formed of 20 pairs InGaAsP and InP layers, while FIG. 5B shows the reflectivity of a DBR 50 formed of 30 pairs of InGaAsP and InP layers. As mentioned above, the refractive index ratio for an InGaAsP/InP DBR 50 is 3.48:3.17. Both FIGS. 5A and 5B illustrate that the DBR 50 has been optimised for reflection at 1.55 μm. It can be seen from comparison of FIGS. 5A and 5B that superior reflectivity at this wavelength is achieved by the DBR 50 having 30 pairs of InGaAsP and InP layers. The examples discussed above use a p-on-n design, for example as shown in FIG. 1, with the substrate being n-doped. However, as an alternative, an n-on-p device is also possible.

Figure 6A:
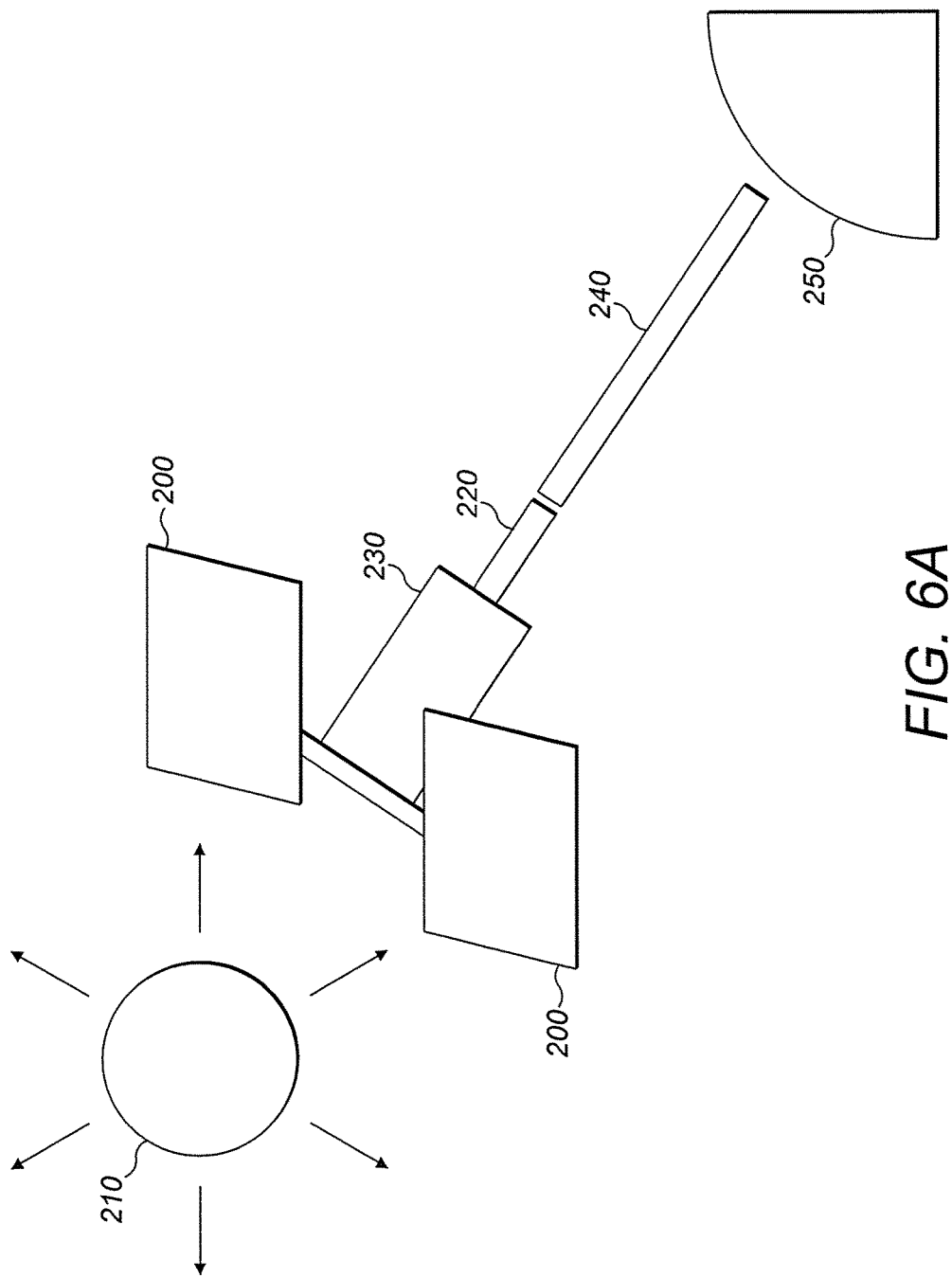
FIGS. 6A to 6C show example systems incorporating an LPC.
Figure 6B:
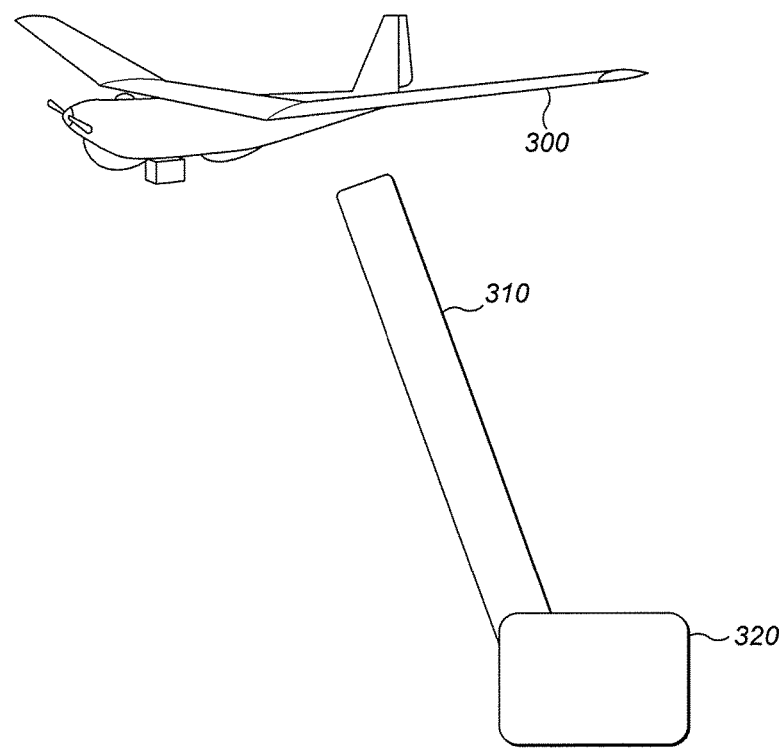
Figure 6C:
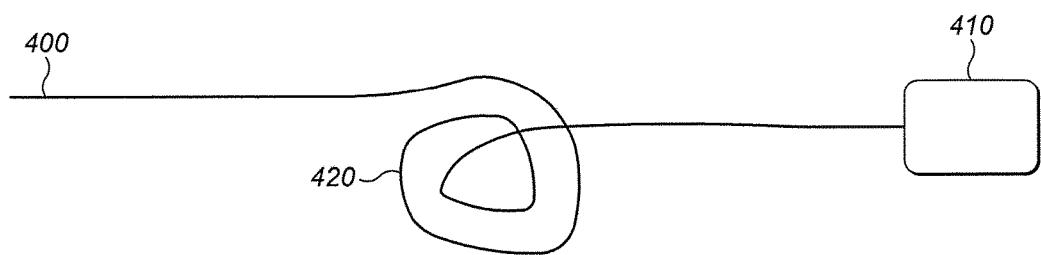

An LPC as described may be used in systems such as a space based solar power system, an example of which is shown in FIG. 6A, a system for remote powering of equipment, an example of which is shown in FIG. 6B, a system which delivers fibre-optic power remotely, an example of which is shown in FIG. 6C and a system for subcutaneous powering of equipment such as a pacemaker (not shown).

In the system shown in FIG. 6 solar panels 200 convert optical energy from the sun 210 into electrical energy which is used to drive a high power laser 220 (at 1550 nm) on-board a sun-synchronous satellite 230. The laser beam 240 is beamed down to the target location 250 (for example, the earth, a moon base or another satellite in need of power) where the laser's optical energy is converted back in to electrical energy using an LPC array (not shown). This may result in on-demand power at any time and any target location equipped with the LPC array.

In the system shown in FIG. 6B, equipment such as an unmanned aerial vehicle (UAV) 300 may be fitted with an LPC array and line of sight powered remotely with a laser beam 310 from a 1550 nm laser source 320.

In the system shown in FIG. 6C, equipment 400 having an LPC array may be powered remotely from a 1550 nm laser source 410 via an optical fibre 420.

Although a laser is discussed above as a suitable narrow linewidth source and the term 'laser power converter' used, other sources exist and may be used with an LPC, depending on the application, as known by the skilled person, such as superluminescent LEDs or filtered light from a broad-band source.

It is to be understood that various modifications to the preferred embodiment and the generic principles and features described herein will be readily apparent to those skilled in the art. The present invention is not intended to be limited to the embodiment shown and such variations and modifications also fall within the spirit and scope of the claims.

The invention claimed is:

1. A laser power converter 'LPC' device for receiving incident electromagnetic radiation at a wavelength of about 1550 nm, the device comprising:
   a substrate comprising InP; and
   an active region comprising an n-doped layer and a p-doped layer, the n-doped and p-doped layers being formed of $In_yGa_{1-y}As_xP_{1-x}$ lattice matched to the substrate and being arranged to absorb photons of electromagnetic radiation having an associated wavelength of about 1550 nm where x =0.948, 0.957, 0.965, 0.968, 0.972, or 0.976 and y=0.557, 0.553, 0.549, 0.547, 0.545, or 0.544 respectively.

2. A device according to claim 1, further comprising a reflecting element tuned to reflect electromagnetic radiation at a wavelength of about 1550 nm.

3. A device according to claim 2, wherein the reflecting element is a Distributed Bragg Reflector comprising alternate layers of a first material and a second material.

4. A device according to claim 3, wherein the first material is an active semiconductor material.

5. A device according to claim 3, wherein the substrate is formed of the second material.

6. A device according to claim 3, wherein the Distributed Bragg Reflector is lattice matched to the substrate.

7. A device according to claim 3, wherein the Distributed Bragg Reflector is disposed between the substrate and the active region.

8. A device according to claim 3, further comprising:
an anode in direct contact with the p-doped layer; and
a cathode in direct contact with the n-doped layer,
wherein the anode and the cathode are arranged such that an optical pathway exists between the active region and the reflecting element that does not pass through either the anode or the cathode.

9. A device according to claim 4, wherein the n-doped layer and the p-doped layer are separated in a first direction and the anode and the cathode are separated in a second direction perpendicular to the first direction.

10. A device according to claim 8, wherein the anode and the cathode are disposed in troughs extending from a surface of the device to the active region.

11. A device according to claim 8, further comprising one or more insulating layers disposed between the p-doped layer of the active region and the cathode and/or between the n-doped layer of the active region and the anode.

12. A device according to claim 8, wherein the n-doped layer comprises an n-doped absorption layer and an n-doped contact layer, and wherein the cathode is in direct contact with the n-doped contact layer.

13. A device according to claim 1, further comprising an electron blocking layer disposed between the active region and a/the substrate, wherein the composition of the electron blocking layer is such that a conduction band offset exists at an interface between the active region and the electron blocking layer.

14. An array of LPC devices, the array comprising:
a plurality of LPC devices according to claim 1;
a plurality of connection means arranged to connect the devices within the array.

15. A system for receiving electromagnetic radiation, the system comprising:
an LPC device or array of devices according to claim 1.

16. A system according to claim 15, further comprising an optical fibre from which the LPC is arranged to receive the electromagnetic radiation.

17. A system according to claim 15, further comprising a narrow linewidth source arranged to transmit the electromagnetic radiation.

18. A system according to claim 17, wherein the narrow linewidth source is a laser.

19. A system according to claim 17, wherein the system is a laser power beaming system.

20. A method of converting, in a laser power converter 'LPC' device, electromagnetic radiation having a wavelength of about 1550 nm into electrical power, the method comprising the steps of:
receiving the electromagnetic radiation and converting it to electrical power in an active region of the LPC device, which active region comprises an n-doped layer and a p-doped layer, the n-doped layer and the p-doped layer being formed of $In_yGa_{1-y}As_xP_{1-x}$ lattice matched to an InP substrate of the LPC device and arranged to have a band gap at an associated wavelength of about 1550 nm, where x=0.948, 0.957, 0.965, 0.968, 0.972, or 0.976 and y=0.557, 0.553, 0.549, 0.547, 0.545, or 0.544 respectively; and
extracting electrical energy from the LPC device.

21. A method of electrical power transmission, the method comprising the steps of:
inputting electrical power to a narrow linewidth source;
outputting from the narrow linewidth source electromagnetic radiation having a wavelength of about 1550 nm;
converting the electromagnetic radiation into electrical power using the method of claim 20.

22. A method according to claim 21, wherein the narrow linewidth source is a laser.

23. A method for manufacturing a laser power converter 'LPC' for receiving incident electromagnetic radiation at a wavelength of about 1550 nm, the method comprising the steps of:
forming a substrate of InP; and
forming an active region comprising an n-doped layer and a p-doped layer, the n-doped and p-doped layers being formed of $In_yGa_{1-y}As_xP_{1-x}$ lattice matched to the InP substrate and being arranged to absorb photons of electromagnetic radiation having an associated wavelength of about 1550 nm, where x=0.948, 0.957, 0.965, 0.968, 0.972, or 0.976 and y=0.557, 0.553, 0.549, 0.547, 0.545, or 0.544 respectively.

* * * * *